United States Patent
Wang et al.

(10) Patent No.: US 6,782,897 B2
(45) Date of Patent: Aug. 31, 2004

(54) METHOD OF PROTECTING A PASSIVATION LAYER DURING SOLDER BUMP FORMATION

(75) Inventors: Chung-Yu Wang, Jung-he (TW); Chender Huang, Hsin-Chu (TW); Pei-Haw Tsao, Taichung (TW); Ken Chen, Hsinchu (TW); Hank Huang, Jungli (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 80 days.

(21) Appl. No.: 10/154,069

(22) Filed: May 23, 2002

(65) Prior Publication Data

US 2003/0219987 A1 Nov. 27, 2003

(51) Int. Cl.⁷ .......................... H01L 21/302; B08B 6/00
(52) U.S. Cl. ........................ 134/1.2; 438/612; 438/738; 438/751; 216/78
(58) Field of Search .................... 438/612, 613, 438/614, 738, 751; 216/77, 78, 102, 105; 134/1.2

(56) References Cited

U.S. PATENT DOCUMENTS

| | | |
|---|---|---|
| 6,440,836 B1 | 8/2002 | Lu et al. ............... 438/612 |
| 2002/0086512 A1 | 7/2002 | Min ..................... 438/613 |
| 2003/0155408 A1 | 8/2003 | Fanti et al. ........... 228/215 |
| 2003/0157438 A1 | 8/2003 | Tong et al. ........... 430/314 |

*Primary Examiner*—George A. Goudreau
(74) *Attorney, Agent, or Firm*—Tung & Associates

(57) ABSTRACT

A method for protecting a passivation layer during a solder bump formation process including providing a semiconductor process wafer having a process surface including at least two metal layers comprising an uppermost metal layer and a lowermost metal layer said lowermost metal layer overlying a passivation layer including metal bonding pad regions; photolithographically patterning and anisotropically etching through a first thickness portion of at least the uppermost metal layer to form a first patterned metal layer portion disposed over the metal bonding pad regions and reveal a second thickness portion including the lowermost metal layer; forming a solder bump over the first patterned metal layer portion according to at least a first reflow process; and, anisotropically etching through the second thickness portion surrounding the completely formed solder bump to reveal the passivation layer.

18 Claims, 2 Drawing Sheets

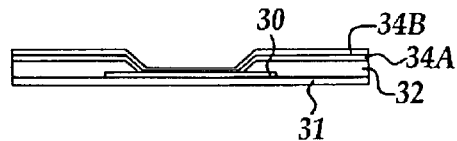
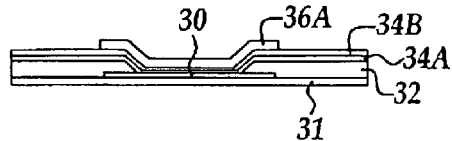
*Figure 3A*  *Figure 3B*
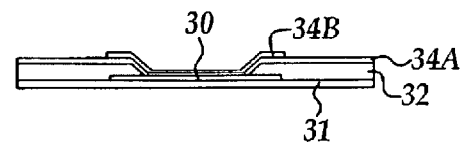
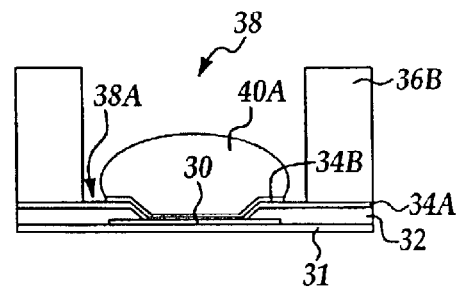
*Figure 3C*  *Figure 3D*
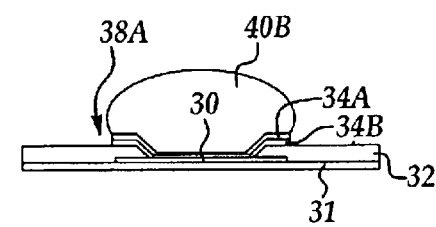
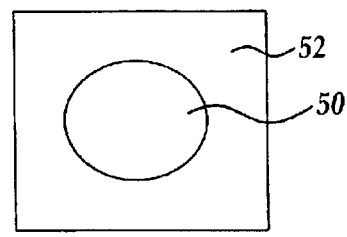
*Figure 3E*  *Figure 4*

METHOD OF PROTECTING A PASSIVATION LAYER DURING SOLDER BUMP FORMATION

FIELD OF THE INVENTION

This invention generally relates to semiconductor processing and more particularly solder bump formation in flip chip bonding technology and a method for protecting an uppermost passivation layer from flux staining and organic residue formation during the solder bump formation process.

BACKGROUND OF THE INVENTION

Packaging of the ULSI chip is one of the most important steps in ULSI manufacturing, contributing significantly to the overall cost, performance and reliability of the packaged chip. As semiconductor devices reach higher levels of integration, packaging technologies such as chip bonding have become critical. Packaging of the chip accounts for a considerable portion of the cost of producing the device and failure of the package leads to costly yield reduction.

As semiconductor device sizes have decreased, the density of devices on a chip has increased along with the size of the chip thereby making chip bonding more challenging. Packaging of the ULSI chip is one of the most important steps in ULSI manufacturing, contributing significantly to the overall cost, performance and reliability of the packaged chip. As semiconductor devices reach higher levels of integration, packaging technologies such as chip bonding have become critical. Packaging of the chip accounts for a considerable portion of the cost of producing the device and failure of the package leads to costly yield reduction.

One of the major problems leading to package failure as chip sizes increase are problems affecting device materials in high thermal treatment process, for example thermal coefficient of expansion (TCE) mismatches between materials leading to stress buildup and the inability of the device materials to withstand necessary processing temperatures. For example, in flip chip technology chip bonding is accomplished by means of solder bumps formed on under bump metallization (UBM) layers overlying a chip bonding pad where, frequently, high thermal treatments necessary to achieve solder reflow and solder bump formation can lead to damage or undesirable interaction of the solder with adjacent or underlying organic device materials.

Generally solder bump formation includes deposition of a solder material, for example, by physical vapor deposition, electroplating or stencil printing of solder paste into a patterned photoresist stencil pattern. In one approach, a first reflow process is carried out to partially form the solder bump including wetting and forming an adhesion bond with an uppermost underlying metal layer referred to as a wetting layer in a series of metal layers referred to as an under bump metal (UBM) system. The stencil is then removed and a second reflow process is carried out to homogenize and shape the solder bump with the help of surface tension.

In order to form the stencil and define the area over which solder paste will be applied, such as the chip bonding pad, a thick film of photoresist also referred to a dry film resist (DFR) is used to pattern and define an area for depositing the solder paste, for example, by stencil printing. The DFR is then exposed to activating light through a mask to define a pattern overlying the chip bonding pads. Following exposure, the DFR is developed, for example, by a wet chemical process where selected portions of the patterned DFR are removed according to selective dissolution to create a pattern of openings for solder column formation. Following a solder column formation step including, for example, solder paste stencil printing to fill the openings in the patterned DFR, it is necessary to strip (remove) the remaining DFR, for example, by a wet chemical stripping process prior to subsequent processing steps to complete the formation of solder bumps.

It is highly important to completely remove developed portions of the photoresist pattern to avoid problems with subsequent processing steps. In this regard, a reactive ion etch (RIE) cleaning process is frequently performed to ensure removal of the DFR following the photolithographic development process to form the solder column openings. Incomplete removal of the DFR according to a developing procedure or a stripping procedure will lead to subsequent processing defects including improperly formed solder bumps and improperly plasma etched surfaces over the bonding pad.

For example, referring to FIGS. 1A≧1E are shown exemplary stages in the solder bump manufacturing process including a cross sectional side view portion of a semiconductor wafer. Shown in FIG. 1A is chip bonding pad 10, for example Cu or Al, formed for example by vapor deposition or electroplating on the upper surface 8 of an underlying multi-level semiconductor device.

Still referring to FIG. 1A, after the chip bonding pad 10 is formed, one or more passivation layers 12 including, for example, a first layer of silicon nitride including an overlying layer of an organic material, for example, polyimide is formed over the semiconductor device surface excluding an area overlying the chip bonding pad 10. Typically, one or more under bump metallization (UBM) layers of from about 500 Angstroms to about 5000 Angstroms is then deposited over chip bonding pad 10 to form a UBM system, e.g., 14A and 14B. Referring to FIG. 1B, a photolithographic patterning and reactive ion etch (RIE) process is performed to etch back the UBM system to reveal the uppermost passivation layer and to leave pre-patterned UBM layers, e.g., 14A and 14B overlying the chip bonding pad. The UBM system including layers 14A and 14B typically includes at least an adhesion layer (e.g., 14A), for example, titanium or aluminum, for adhering to the chip bonding pad and an overlying wetting layer (e.g., 14B), for example copper or nickel, for wetting and forming an adhesion bond with a subsequently formed overlying solder bump.

Referring to FIG. 1C, a layer of dry film photoresist (DFR) 16 is formed over the exposed passivation layer and pre-patterned UBM system and photolithographically patterned to form a solder column opening 16A overlying and encompassing the patterned UBM system, the solder column opening typically being slightly larger in dimension than the UBM system e.g., 14A and 14B. Prior to depositing solder material into solder column opening 16A, for example, by stencil printing solder paste, the bottom portion of the DFR opening including the UBM system and the exposed uppermost passivation layer surface area 16B, are subjected to a plasma (RIE) cleaning process to remove residual DFR. During the plasma cleaning process the exposed passivation layer surface area 16B, is etched thereby reducing the passivation layer thickness and roughening the passivation layer surface area 16B thereby making it more susceptible to subsequent organic residue adhesion and staining.

Referring to FIG. 1D, in a typical approach to forming a solder bump, solder paste is screen printed into the patterned stencil including solder column opening 16A and heated in a first reflow process to form partially formed solder bump 18A as shown. Referring to FIG. 1E, the DFR is then removed by a wet chemical stripping process followed by coating the solder bumps with flux and performing a second reflow process to better homogenize and finalize the shape of the solder bump 18B and to improve adhesion with the wetting layer 14B of the UBM system.

One problem with the prior art solder bump formation process relates to the thermal degradation of the DFR layer following a first reflow process and the interaction of flux contained in the solder material with the roughened passivation layer surface area. For example, referring to FIG. 2 is shown a top planar view of a portion of a semiconductor surface having stained passivation layer surface region e.g., 20 surrounding an exemplary completed solder bump 22. The stained region e.g., 20 is believed to be formed by interaction of both flux and thermally degraded DFR during the first reflow process. Following the second reflow process the stained region including photoresist residue is difficult to remove by conventional wet stripping processes. As a result, the photoresist residue may adversely affect subsequent semiconductor wafer processing steps. For example, the photoresist residue may adversely affect the second reflow process to form the solder ball, for example interfering with proper wetting of the UBM layer, or result in current leakage adversely affecting device functioning. Consequently, semiconductor device quality suffers and die yield is reduced.

There is therefore a need in the semiconductor processing art to develop an improved solder bump formation process whereby solder and photoresist interaction with the semiconductor surface is avoided thereby avoiding residue formation and staining of the semiconductor surface surrounding the solder bumps to improve device quality and die yield.

It is therefore an object of the invention to provide an improved solder bump formation process whereby solder and photoresist interaction with the semiconductor surface is avoided thereby avoiding residue formation and staining of the semiconductor surface surrounding the solder bumps to improve device quality and die yield, while overcoming other shortcomings and limitations of the prior art.

SUMMARY OF THE INVENTION

To achieve the foregoing and other objects, and in accordance with the purposes of the present invention, as embodied and broadly described herein the present invention provides a method for protecting a passivation layer during a solder bump formation process.

In a first embodiment, the method includes providing a semiconductor process wafer having a process surface including at least two metal layers comprising an uppermost metal layer and a lowermost metal layer said lowermost metal layer overlying a passivation layer including metal bonding pad regions; photolithographically patterning and anisotropically etching through a first thickness portion of at least the uppermost metal layer to form a first patterned metal layer portion disposed over the metal bonding pad regions and reveal a second thickness portion including the lowermost metal layer; forming a solder bump over the first patterned metal layer portion according to at least a first reflow process; and, anisotropically etching through the second thickness portion surrounding the completely formed solder bump to reveal the passivation layer.

These and other embodiments, aspects and features of the invention will be better understood from a detailed description of the preferred embodiments of the invention which are further described below in conjunction with the accompanying Figures.

BRIEF DESCRIPTION OF THE DRAWINGS

FIGS. 3A–3E are cross-sectional side view representations of stages in a solder bump manufacturing process according to embodiments of the present invention.

FIG. 4 is a top planar view of a portion of a semiconductor die surface showing an exemplary solder bump formed according to embodiments of the present invention.

DETAILED DESCRIPTION OF THE PREFERRED EMBODIMENTS

Figure 1A:
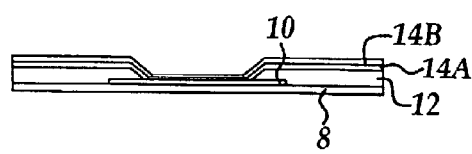
FIGS. 1A–1E are cross-sectional side view representations of stages in a manufacturing process according to the prior art for forming a solder bump over a chip bonding pad.
Figure 1B:
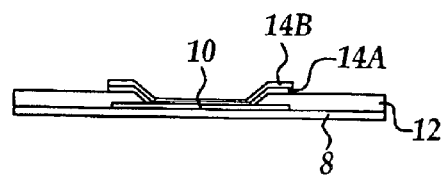
Figure 1C:
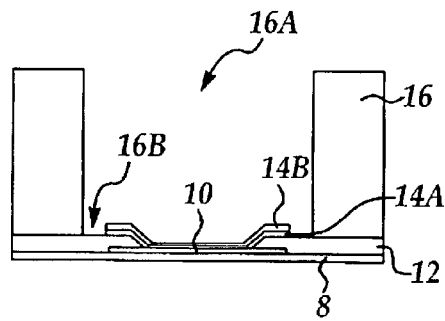
Figure 1D:
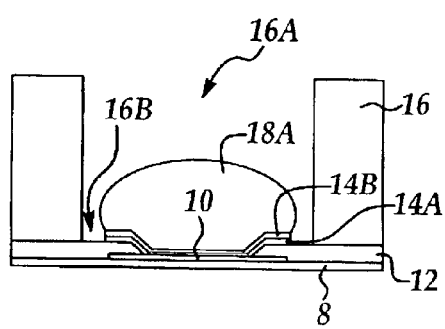
Figure 1E:
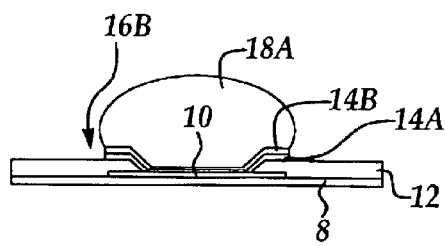
Figure 2:
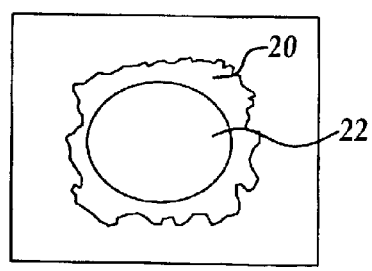
FIG. 2 is a top planar view of a portion of a semiconductor die surface showing an exemplary solder bump including a stained passivation layer region according to the prior art solder bump manufacturing process.

Although the method of the present invention is explained with reference to a solder bump formation process where solder past printing is used to deposit the solder material, it will be recognized that any solder material deposition method may be used in the method of the present invention including for example, physical vapor deposition (PVD), chemical vapor deposition (CVD), or electroplating. Further, although the method of the present invention has the benefit of advantageously avoiding the interaction of either solder flux or photoresist with the semiconductor surface, for example, a passivation layer, it will be appreciated that the method of the present invention may be advantageously adapted to prevent the interaction of either photoresist or solder material with any surface surrounding the solder bump including various passivation layer materials.

Referring to FIGS. 3A–3E are representative cross-sectional side views of exemplary stages in a manufacturing process according to embodiments of the present invention for creating a solder bump. The solder bump is bonded to an uppermost UBM layer leaving at least one UBM layer overlying a passivation layer to avoid organic and/or solder material residues from interacting with the passivation layer to produce passivation layer staining. Referring to FIG. 3A, the process of creating the solder bumps begins after chip bonding pad 30, for example Cu or Al, typically formed by vapor deposition, has been formed over the upper surface 31 of a semiconductor device die substrate, for example an underlying insulating dielectric layer forming an upper level of a semiconductor device. After the chip bonding pad 30 is formed, a passivation layer system 32, for example, including one or more layers of silicon nitride (SiN), polyimide, and Benzocyclobutene (BCD), are formed over the substrate surface 31 excluding an area overlying the chip bonding pad 30. Typically, one or more under bump metallization (UBM) layers to form a UBM system, e.g., 34A and 34B of from about 500 Angstroms to about 5000 Angstroms in thickness are then deposited, for example by physical vapor deposition, over the semiconductor process wafer surface including the uppermost passivation layer and exposed areas of chip bonding pad 30.

In an exemplary embodiment, the UBM system includes adhesion layer 34A including at least one metal layer formed of, for example, titanium, chromium, or aluminum, or alloys thereof and an overlying wetting layer 34B including at least one metal layer of, for example, copper (Cu), an alloy of chromium copper (CrCu), nickel (Ni), vanadium (V), or alloys thereof. For example, in a preferable three layer UBM system, the UBM system includes an adhesion layer 34A of aluminum followed by a wetting layer 34B of nickel vanadium alloy (NiV) with an overlying contact layer (not shown) of copper.

According to an embodiment of the present invention, the UBM system is formed of one or more UBM layers, preferably at least an adhesion layer and at an overlying wetting layer. The wetting layer, for example, may comprise more than one layer including an uppermost contact layer for contacting a subsequently formed overlying solder material for forming a solder ball. According to an embodiment of the present invention the UBM system is pre-patterned, preferably by a photolithographic and RIE process to leave at least one patterned UBM uppermost layer including at least a thickness portion of the wetting layer for contacting the a subsequently formed overlying solder bump and leaving at least a thickness portion at least one UBM layer, for example, an adhesion layer, covering the substrate surface including an uppermost passivation layer to form a protective layer over the uppermost passivation layer.

For example, in an exemplary embodiment, referring to FIG. 3B, a first layer of photoresist for pre-patterning the UBM system (e.g., UBM layers 34A and 34B) is deposited and patterned by conventional photolithographic processes to leave photoresist layer portion 36A forming an etching mask overlying the chip bonding pad 30 area including a UBM system portion including layers 34A and 34B.

Referring to FIG. 3C, according to an embodiment of the present invention, in a UBM system patterning process, a thickness portion of the uppermost layers of the UBM system, for example UBM layer 34B (e.g., including a wetting and contact layer) is anisotropically etched through a thickness portion according to a conventional reactive ion etching (RIE) process to remove a thickness portion of UBM layer 34B area not covered by photoresist layer 36A (see FIG. 3B). In etching through a thickness portion of the uppermost metal layers of the UBM system, preferably a thickness portion of at least one metal layer, e.g., adhesion layer 34A, is left overlying passivation layer 32 to form a patterned thickness metal layer portion of the UBM system, e.g., wetting layer 34B, overlying bonding pad 30. Following the anisotropic etching process to form the patterned metal layer thickness portion of the UBM system, the photoresist layer portion 36A (see FIG. 3B) is removed by a conventional striping process using, for example, a plasma ashing process or a wet chemical stripping process leaving the pre-patterned UBM system shown in FIG. 3C. It will be appreciated that more than one metal layer may comprise the UBM adhesion layers and wetting layers. Preferably, at least a thickness portion of at least one metal layer of the UBM system, e.g., adhesion layer 34A, remains overlying an uppermost passivation layer of passivation layer system 32 following the UBM patterning process.

Referring to FIG. 3D, following the UBM patterning process dry film photoresist (DFR) layer 36B, for example about 100 to about 150 microns in thickness, is applied over the substrate surface including exposed UBM adhesion layer portion 34A and photolithographically patterned by a conventional process to form a stencil pattern including solder column opening, e.g., 38, overlying the bonding pad 30 and overlying patterned UBM layers, e.g., 34B. The DFR layer 36B is typically subjected to a pre-patterning bake to drive off a proportion of the solvent and impart dimensional stability to the film. In an exemplary embodiment of the present invention, the patterned solder column opening 38 encompasses and has a larger diameter (dimension) than the patterned UBM layer e.g., 34B diameter to reveal a portion e.g., 38A of the protective UBM adhesion layer 34A at the bottom portion of the solder column opening 38. Prior to applying the solder material to fill solder column opening 38 the solder column opening is optionally subjected to a conventional plasma cleaning process, for example, an RIE process including oxygen to remove any residual DFR remaining within the solder column opening 38 from the patterning process. In the plasma cleaning process, according to the present invention, the uppermost passivation layer of passivation layer system 32 is protected from etching by the overlying thickness portion of UBM adhesion layer 34A at e.g., area 38A.

Still referring to FIG. 3D, the stencil pattern including solder column opening 38 is then filled with solder material, for example, solder paste according to a conventional stencil printing process to form solder column (not shown) followed by at least a first reflow process at an appropriate thermal treatment (reflow) temperature, for example, greater than about 300° C., e.g., 350° C., to allow the solder paste to partially homogenize to partially form solder bump 40A adhering to underlying patterned UBM wetting layer 34B.

Referring to FIG. 3E, the DFR layer 36B is stripped, for example, by a conventional wet chemical stripping process and the partially formed solder bump is coated with a conventional flux material prior to subjecting the partially formed solder bump to at least a second reflow process at an appropriate thermal treatment (reflow) temperature, for example, greater than about 300° C., to complete the homogenization of the solder material, e.g., solder paste, and shape a fully formed solder bump 40B according to the surface tension of the solder bump on the underlying UBM layer 34B. Following the second reflow process, an homogeneous solder bump of e.g., a Pb/Sn alloy is formed including, for example, alloy compositions having 95 wt % Pb/5 wt % Sn and 90 wt % Pb/10 wt % Sn.

Still referring to FIG. 3E, according to another aspect of the present invention, following the second reflow process, the exposed UBM adhesion layer thickness portion 34A is subjected to an RIE etching process using the solder bump 40B as an etching mask to remove the remaining thickness portion of the exposed UBM adhesion layer thickness portion 34A to reveal the uppermost underlying passivation layer of passivation layer system 32. The RIE etching process preferably includes a conventional metal etching chemistry for etching, for example, titanium, chromium, or aluminum.

Thus, an improved method has been presented for a solder bump formation process whereby solder material and photoresist interaction with the semiconductor surface, for example a passivation layer is avoided by at least a thickness portion of at least one protective metal layer forming a lower portion of the UBM system thereby avoiding residue formation and staining of the semiconductor surface surrounding the solder bumps to improve device quality and die yield. For example, referring to FIG. 4 is shown a top planar view of a portion of a semiconductor wafer surface showing an exemplary solder bump 50 and an uppermost passivation layer 52 surrounding the solder bumps following solder bump formation according to embodiments of the present invention. In contrast with the prior art solder bump formation processes, organic residues and/or staining of the uppermost passivation layer is absent, the passivation layer having been protected during the solder bump reflow processes by leaving at least a thickness portion of the UBM system, for example, an adhesion layer thickness portion, overlying an uppermost passivation layer. As a result, semiconductor device quality and die yield have been improved according to preferred embodiments of the present invention.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A method for protecting a passivation layer during a solder bump formation process comprising the steps of:

providing a semiconductor process wafer having a process surface including at least two metal layers comprising an uppermost metal layer and a lowermost metal layer said lowermost metal layer overlying passivation layer including metal bonding pad regions;

photolithographically patterning and etching through a first thickness portion of at least the uppermost metal layer to form a first patterned metal layer portion disposed over the metal bonding pad regions and reveal a second thickness portion including the lowermost metal layer;

subjecting the openings to a plasma cleaning process to remove residual organic material.

forming a solder bump over the first patterned metal layer portion according to at least a first reflow process; and, etching through the second thickness portion surrounding the completely formed solder bump to reveal the passivation layer.

2. The method of claim 1, wherein the passivation layer includes an organic material with a glass transition temperature greater than about 300 degrees Centigrade.

3. The method of claim 1, wherein the passivation layer includes at least one of a polyimide and Benzocyclobutene.

4. The method of claim 1, wherein the step of forming a solder bump further includes depositing solder paste to fill openings in a patterned photoresist layer formed overlying the first patterned metal layer portion.

5. The method of claim 4, further comprising the steps of:

removing the patterned photoresist layer following the at least a first reflow process, and, subjecting the solder bump to at least a second reflow process.

6. The method of claim 4, wherein the solder paste is for forming a lead/tin alloy.

7. The method of claim 6, wherein the lead/tin alloy includes a lead content greater than or equal to about 90 weight percent.

8. The method of claim 1, wherein the adhesion layer includes at least one of titanium, aluminum, and chromium.

9. The method of claim 1, wherein the wetting layer includes at least one of copper, chromium, nickel, and vanadium.

10. A method for protecting a passivation layer with under bump metallization (UBM) during a solder bump formation process comprising the steps of:

providing a semiconductor process wafer having a process surface including at least two UBM metal layers including an adhesion layer formed overlying a passivation layer including an exposed bonding pad region and an uppermost wetting layer for forming a solder bump thereover;

photolithographically patterning and etching according to a first reactive ion etch process through a first thickness portion including the uppermost wetting layer to form a first patterned UBN metal portion disposed over the bonding pad region to leave a second thickness portion including a thickness portion of the adhesion layer;

subjecting the openings to a plasma cleaning process to remove residual organic material;

depositing solder material according to a patterned photoresist layer having openings overlying the first patterned metal portion;

forming a partially formed solder bump from the solder material over the first patterned UBM metal portion according to at least a first reflow process;

removing the patterned photoresist layer;

subjecting the partially formed solder bump to at least a second reflow process to form a completely formed solder bump; and, etching according to a second reactive ion etching process through the second thickness portion to reveal the passivation layer surrounding the completely formed solder bump.

11. The method of claim 10, wherein the passivation layer includes an organic material with a glass transition temperature greater than about 300 degrees Centigrade.

12. The method of claim 10, wherein the passivation layer includes at least one of a polyimide and Benzocyclobutene.

13. The method of claim 10, wherein the step of depositing solder material includes depositing solder paste according to a stencil printing process.

14. The method of claim 10, wherein the completely formed solder bump is lead/tin alloy.

15. The method of claim 14, wherein the lead/tin alloy includes a lead content of at least about 90 weight percent.

16. The method of claim 10, wherein the adhesion layer includes at least one of titanium, aluminum, and chromium.

17. The method of claim 10, wherein the wetting layer includes at least one of copper, chromium, nickel, and vanadium.

18. The method of claim 10, wherein the at least two UBM metal layers includes a phasing/wetting layer formed of two metal layers the uppermost of the two metal layers including copper or an alloy thereof and the lowermost of the two metal layers including a nickel/vanadium alloy.

* * * * *